United States Patent
Schurmans et al.

(10) Patent No.: US 9,594,227 B2
(45) Date of Patent: Mar. 14, 2017

(54) SEALING BLOCK WITH STACKABLE SEALING ELEMENTS

(71) Applicants: COMMSCOPE CONNECTIVITY BELGIUM BVBA, Kessel-Lo (BE); ADC Czech Republic S.r.o., Brno (CZ)

(72) Inventors: Eric Schurmans, Geetbets (BE); Ales Smisek, Bolicka (CZ)

(73) Assignees: COMMSCOPE CONNECTIVITY BELGIUM BVBA (BE); ADC CZECH REPUBLIC, S.R.O. (CZ)

( * ) Notice: Subject to any disclaimer, the term of this patent is extended or adjusted under 35 U.S.C. 154(b) by 0 days.

(21) Appl. No.: 14/889,952

(22) PCT Filed: May 9, 2014

(86) PCT No.: PCT/EP2014/059587
§ 371 (c)(1),
(2) Date: Nov. 9, 2015

(87) PCT Pub. No.: WO2014/180993
PCT Pub. Date: Nov. 13, 2014

(65) Prior Publication Data
US 2016/0195687 A1    Jul. 7, 2016

Related U.S. Application Data

(60) Provisional application No. 61/821,324, filed on May 9, 2013.

(51) Int. Cl.
*G02B 6/44* (2006.01)
*H01R 13/52* (2006.01)
(Continued)

(52) U.S. Cl.
CPC ......... *G02B 6/4444* (2013.01); *H01R 13/521* (2013.01); *H01R 13/5208* (2013.01);
(Continued)

(58) Field of Classification Search
CPC G02B 6/4444; H01R 13/521; H01R 13/5208; H01R 13/5221
See application file for complete search history.

(56) References Cited

U.S. PATENT DOCUMENTS

2005/0167147 A1    8/2005  Marsac et al.
2009/0197450 A1*   8/2009  Ooki .................. H01R 13/5208
                                                      439/271

FOREIGN PATENT DOCUMENTS

EP    0 695 900    2/1996
EP    2 538 508    12/2012
FR    2 664 103    1/1992

OTHER PUBLICATIONS

International Search Report and Written Opinion for International Application No. PCT/EP2014/059587 mailed Aug. 21, 2014 (10 pages).

* cited by examiner

*Primary Examiner* — Jerry Rahll
(74) *Attorney, Agent, or Firm* — Merchant & Gould P.C.

(57) ABSTRACT

A seal block assembly (10) includes a housing (12) defining one or more slots (14). Seal block assembly seals a port of a telecommunications box or enclosure. Each seal block element (32) includes a seal block body (34) having first and second body portions (36, 38), and first and second seal portions (40, 42) for sealing around a cable. A sealing system is provided between each seal block element and an adjacent seal block element. A sealing arrangement is also provided between the seal block elements and the slot.

24 Claims, 5 Drawing Sheets

(51) Int. Cl.
*H02G 15/013* (2006.01)
*H02G 3/08* (2006.01)
*H04Q 1/02* (2006.01)
*H05K 5/06* (2006.01)

(52) U.S. Cl.
CPC ......... *H01R 13/5221* (2013.01); *H02G 3/083* (2013.01); *H02G 3/088* (2013.01); *H02G 15/013* (2013.01); *H04Q 1/025* (2013.01); *H05K 5/06* (2013.01)

SEALING BLOCK WITH STACKABLE SEALING ELEMENTS

CROSS-REFERENCE TO RELATED APPLICATION(S)

This application is a National Stage of PCT/EP2014/059587, filed 9 May 2014, which claims benefit to U.S. Patent Application Ser. No. 61/821,324 filed on 9 May 2013, and which application(s) are incorporated herein by reference. To the extent appropriate, a claim of priority is made to each of the above disclosed applications.

BACKGROUND OF THE INVENTION

In telecommunications applications often a box or enclosure is used to house telecommunications equipment. It is necessary to feed fiber optic cables through a wall of the box or enclosure. The fiber optic cables are preferably sealed relative to an exterior of the box or enclosure. Similar arrangements are also possible for electric cables.

SUMMARY OF THE INVENTION

The present invention includes a seal block assembly including a housing which defines one or more slots. Each slot receives one or more seal block elements which seal against cables passing through the seal block assembly. The seal block assembly can be positioned at a port of a box or enclosure.

The seal block element may include a seal block body having first and second mating portions which surround first and second seal portions. The cable or cables are positioned between the first and second portions of the seal block body, and between the first and second seal portions.

The seal block elements are stackable in the one or more slots. Mating elements are provided for sealing between the seal block elements and the housing, and for sealing between each of the seal block elements.

A method of use for sealing a cable is disclosed.

DETAILED DESCRIPTION OF THE PREFERRED EMBODIMENTS

Figure 1:
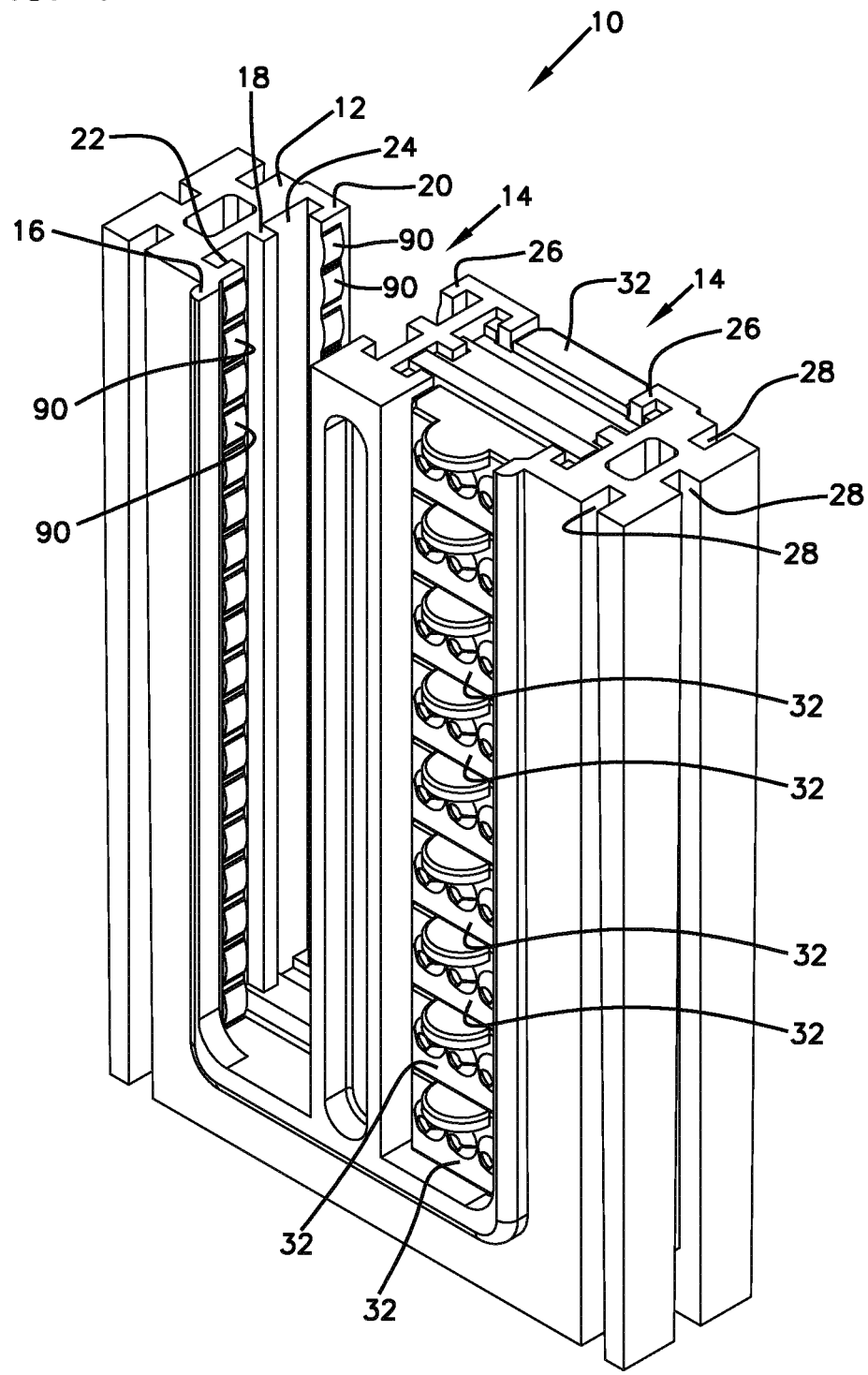
FIG. 1 shows one embodiment of a seal block assembly in accordance with the disclosure of the present invention, with one of the slots being filled with seal block elements, and one of the slots shown prior to being filled with seal block elements.
Figure 2:
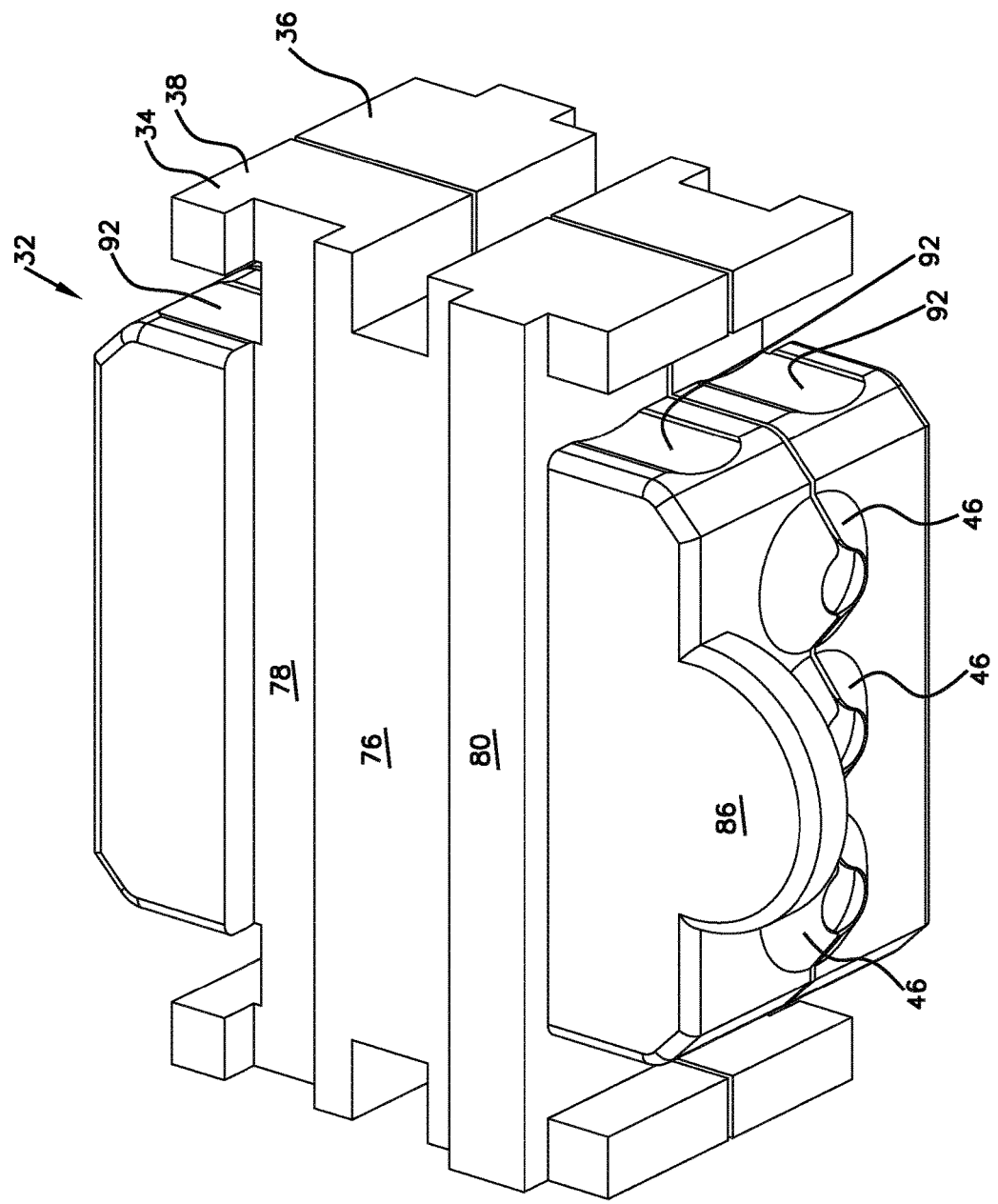
FIG. 2 is a perspective view of a seal block element.
Figure 3:
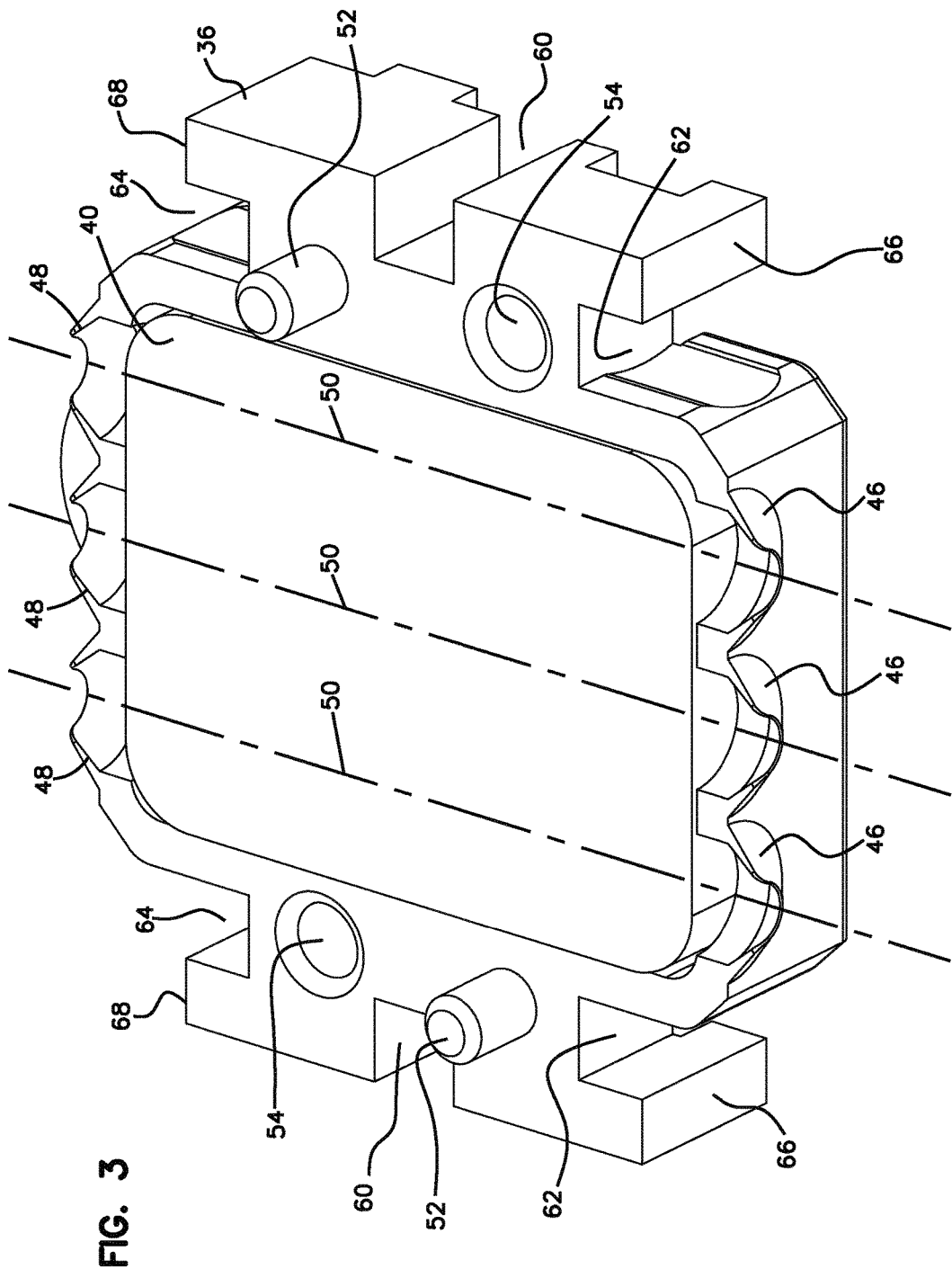
FIG. 3 is a perspective view of a first portion of a seal block element including a first seal portion, the second portion and the second seal portion of the seal block element being identical.
Figure 4:
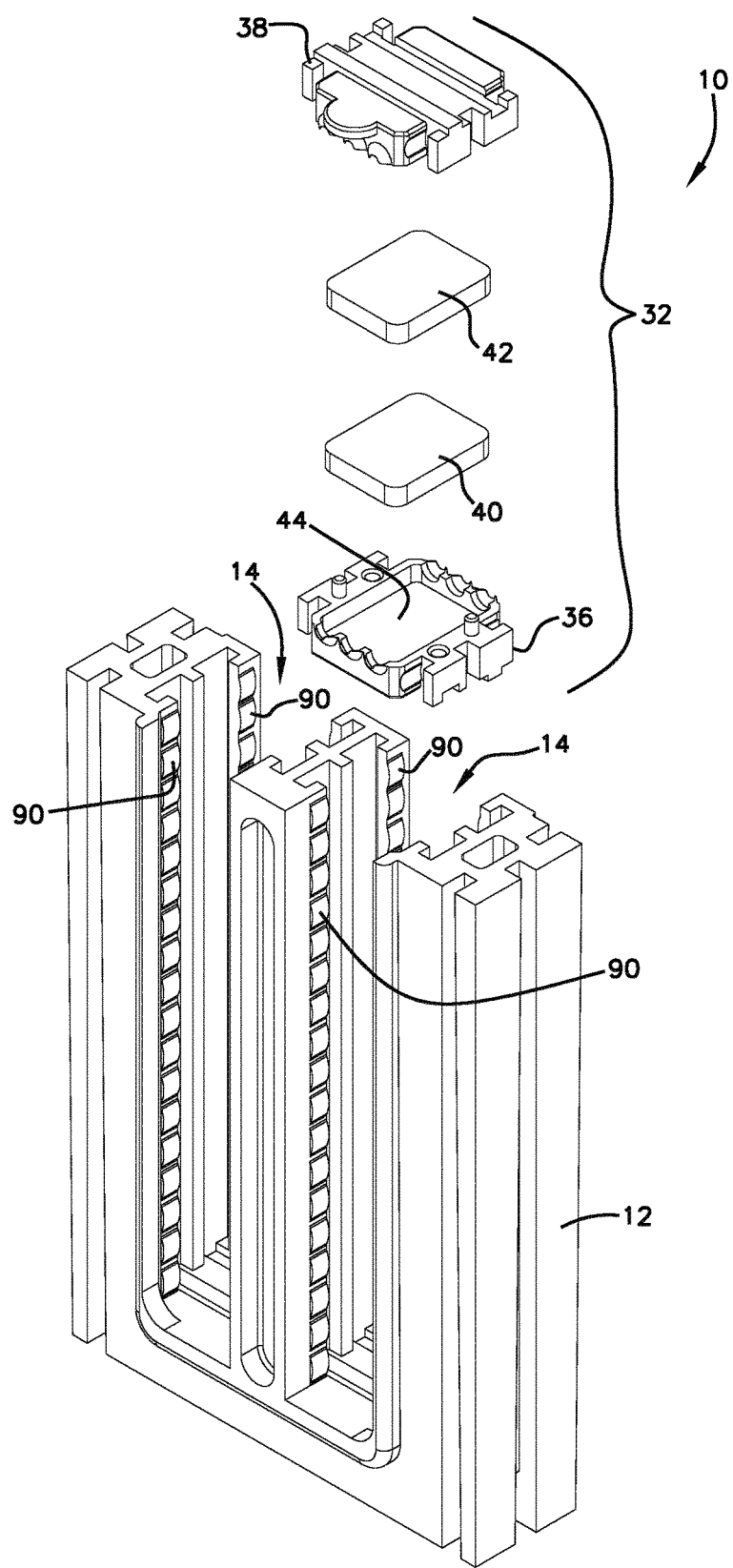
FIG. 4 is a perspective view of the seal block assembly of FIG. 1.
Figure 5:
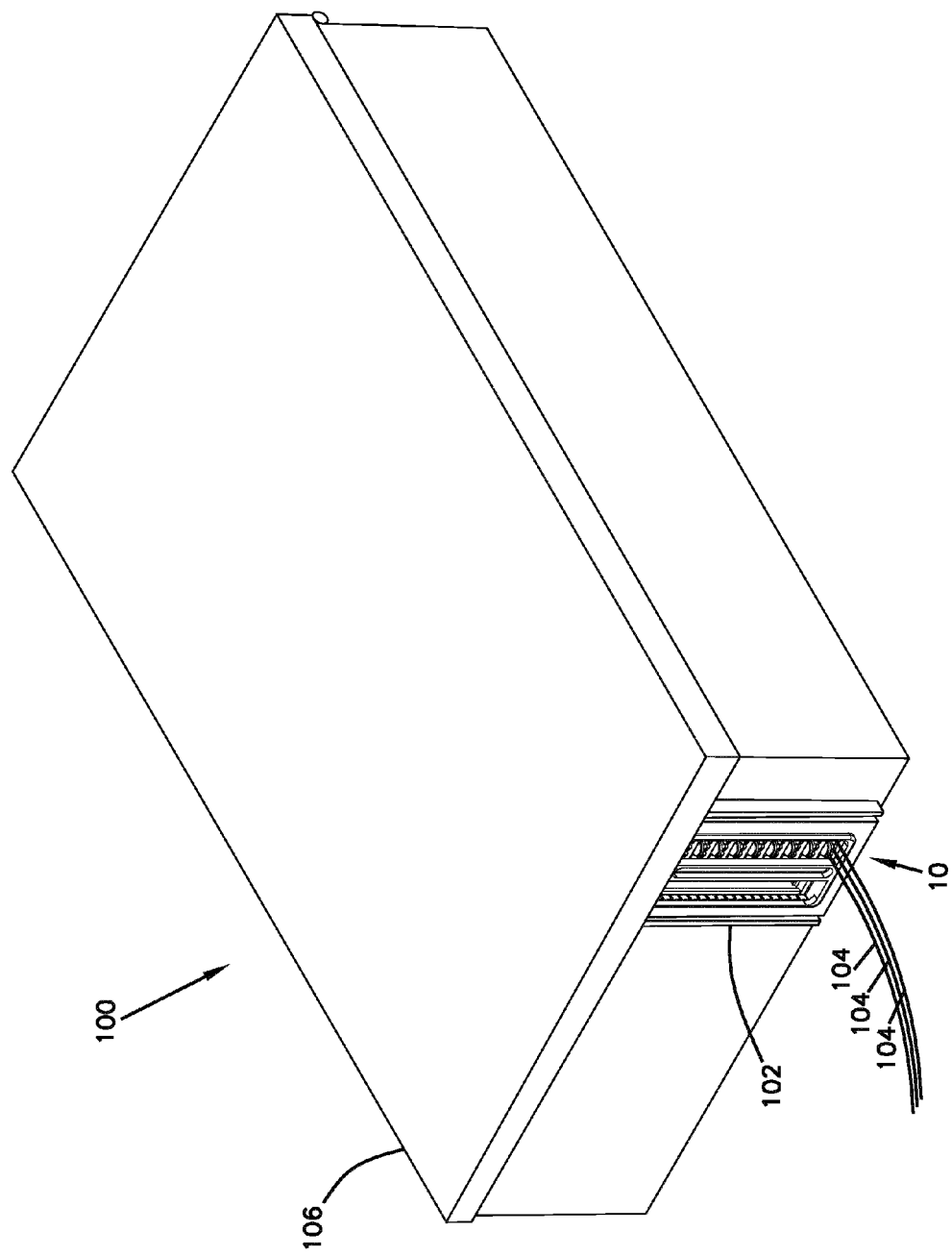
FIG. 5 is a perspective view of an enclosure with the seal block assembly shown in FIG. 1.

Referring now to FIGS. 1-5, a seal block assembly 10 is shown. Seal block assembly 10 is used with a telecommunications box or enclosure 100 at a cable entry or exit port 102. Seal block assembly 10 is useful for sealing the interior of the box or enclosure from the external environment, such as to protect interior telecommunications equipment. Seal block assembly 10 includes a housing 12 which holds a plurality of seal block elements 32. Seal block assembly 10 is used to seal cables 104 entering or exiting enclosure 100.

Housing 12 includes one or more slots 14 which define a U-shape. A top 26 of the U-shape is closed off by a cover 106 of the telecommunications box or enclosure.

Slot 14 includes a front tab 16, a middle tab 18, and a rear tab 20 on each side of slot 14. Each side of slot 14 includes a first slot 22 and a second slot 24. The various tabs and slots mate with features on seal block elements 32 to seal and hold the seal block elements in position.

Housing 12 includes end slots 28 which are useful for mounting seal block assembly 10 to a box or enclosure having a mating structure.

Seal block element 32 includes a seal block body 34 which includes first and second body portions 36, 38 which are mated together to enclose an inner seal. Preferably, first and second body portions 36, 38 are identical in configuration. Contained within each of first body portion 36 and second body portion 38 is a first seal portion 40 and a second seal portion 42, respectively. Each of first and second body portions 36, 38 includes a recess 44 for receiving one of the first and second seal portions 40, 42. First and second seal portions 40, 42 are made from a soft material such as foam or gel to seal between each other and around each cable.

Seal block element 32 includes one or more ports in the form of front ports 46 and rear ports 48. Cables pass through seal block element 32 in a direction of cable axis 50 between front and rear ports 46, 48. During use, seal block element 32 compresses first and second seal portions 40, 42 to seal any cables positioned there between. If desired, seal block element 32 can be utilized without any cables. Alternatively, seal block element 32 can be used with fewer cables than there are ports 46, 48.

Positioned between first and second body portions 36, 38 is a pin 52 and a hole 54 for an interlocking arrangement for alignment and securement of the two elements together. The pin 52 and the hole 54 of one body portion 36, 38 mates with the respective hole 54 and pin 52 of the other body portion 36, 38.

Each of the first and second body portions 36, 38 includes a middle slot 60, a first end slot 62, and a second end slot 64. The first and second body portions 36, 38 also include a first tab 66 and a second tab 68. The slots 60, 62, 64 and the tabs 66, 68 mate with the slots 22, 24 and tabs 16, 18, 20 of slot 14. Such engagement between the various elements provide a sealing effect for sealing between the seal block elements 32 and housing 12. Each of the first and second body portions 36, 38 includes an end surface 76 defining both an end slot 78 and an end tab 80 which extend in a cross-direction relative to cable axis 50. Such arrangement facilitates sealing between the seal block elements 32 in a stacked arrangement within slot 14.

Each of first and second body portions 36, 38 includes a side tab 86 useful for lifting or positioning seal block element 32 in slot 14. Side tab 86 is also useful for moving first body portion 36 relative to second body portion 38 so as to expose an interior of a seal block body 34 for receipt of a cable, or removal of a cable.

Seal block body 34 includes a plurality of recesses 92 which engage bumps 90 on slot 14 to allow for positioning of the seal block elements 32 in a more secure stack. Bumps 90 and recesses 92 form a registration system.

PARTS LIST

10 Seal block assembly
12 Housing
14 Slot
16 Front tab
18 Middle tab
20 Rear tab
22 First slot
24 Second slot
26 Top
28 End slots
32 Seal block element
34 Seal block body
36 First body portion
38 Second body portion
40 First seal portion
42 Second seal portion
44 Recess
46 Front port
48 Rear port
50 Cable axis
52 Pin
54 Hole
60 Middle slot
62 First end slot
64 Second end slot
66 First tab
68 Second tab
76 End surface
78 End slot
80 End tab
86 Side tab
90 Bumps
92 Recesses
100 Enclosure
102 Port
104 Cable
106 Cover

What is claimed is:

1. A seal block assembly comprising:
a housing defining at least one slot;
a seal block element positioned in the at least one slot, the seal block element including a seal block body having a first body portion mated to a second body portion, and a first seal portion mated with a second seal portion for sealing cables; and
a tab and slot arrangement being positioned between the seal block element.

2. The seal block assembly of claim 1, comprising a plurality of the seal block elements in the at least one slot positioned in a column.

3. The seal block assembly of claim 1, comprising two slots side by side in the housing.

4. The seal block assembly of claim 1, wherein a tab and slot arrangement is positioned between each seal block element and the slot.

5. The seal block assembly of claim 1, wherein the first and second body portions are identical.

6. The seal block assembly of claim 1, wherein the seal block element and the slot include a registration system which positions the seal block elements in discrete positions in slot.

7. The seal block assembly of claim 6, wherein the registration system includes a plurality of bumps and a plurality of mating recesses.

8. The seal block assembly of claim 1, further comprising an enclosure with a port, wherein the seal block assembly is positioned in the port for sealing at least one cable.

9. A seal block element comprising:
a seal block body having a first body portion mated to a second body portion, and a first seal portion mated with a second seal portion for sealing cables; and
a tab and slot arrangement for sealing the seal block element in a slot.

10. The seal block element of claim 9, wherein the tab and slot arrangement is configured to seal with an adjacent seal block element.

11. The seal block element of claim 9, wherein the first and second body portions are identical.

12. The seal block element of claim 9, wherein the seal block element and the mating slot include a registration system which positions the seal block element in discrete positions in slot.

13. The seal block element of claim 12, wherein the registration system includes a plurality of bumps and a plurality of mating recesses.

14. A method of sealing a cable for entry and exit from an enclosure, comprising:
providing a seal block assembly including a housing positioned in a port of enclosure;
wherein the housing defines at least one slot, the at least one slot being in the form of a plurality of slots;
positioning a cable in a seal block element positioned in at least one of the plurality of slots, wherein each seal block element includes a seal block body having a first body portion mated to a second body portion, and a first seal portion mated with a second seal portion for sealing a cable.

15. The method of claim 14, further comprising positioning a plurality of seal block elements respectively in one of the plurality of slots.

16. The method of claim 14, wherein each seal block element includes a plurality of cables.

17. A seal block assembly comprising:
a housing defining at least one slot, the at least one slot being in the form of two slots side by side in the housing; and
a seal block element positioned in at least one of the two slots, the seal block element including a seal block body having a first body portion mated to a second body portion, and a first seal portion mated with a second seal portion for sealing cables.

18. A seal block assembly comprising:
a housing defining at least one slot; and
a seal block element positioned in the at least one slot, the seal block element including a seal block body having a first body portion mated to a second body portion, and a first seal portion mated with a second seal portion for sealing cables;
wherein the first and second body portions are identical.

19. A seal block assembly comprising:
a housing defining at least one slot; and
a seal block element positioned in the at least one slot, the seal block element including a seal block body having a first body portion mated to a second body portion, and a first seal portion mated with a second seal portion for sealing cables;
wherein the seal block element and the at least one slot include a registration system which positions the seal block elements in discrete positions in the at least one slot.

20. The seal block assembly of claim 19, wherein the registration system includes a plurality of bumps and a plurality of mating recesses.

21. A seal block element comprising:
   a seal block body having a first body portion mated to a second body portion, and a first seal portion mated with a second seal portion for sealing cables; and
   a tab and slot arrangement to seal with an adjacent seal block element.

22. A seal block element comprising:
   a seal block body having a first body portion mated to a second body portion, and a first seal portion mated with a second seal portion for sealing cables;
   wherein the first and second body portions are identical.

23. A seal block element comprising:
   a seal block body having a first body portion mated to a second body portion, and a first seal portion mated with a second seal portion for sealing cables;
   wherein the seal block element and a mating slot include a registration system which positions the seal block element in discrete positions in the mating slot.

24. The seal block element of claim 23, wherein the registration system includes a plurality of bumps and a plurality of mating recesses.

* * * * *